United States Patent [19]

Unno et al.

[11] Patent Number: 5,677,960
[45] Date of Patent: Oct. 14, 1997

[54] ON-VEHICLE SOUND CONTROL APPARATUS

[75] Inventors: Atsushi Unno, Maebashi; Kiichi Morota, Gunma-ken; Motomichi Matsumura, Isezaki, all of Japan

[73] Assignee: Victor Company of Japan, Ltd., Yokohama, Japan

[21] Appl. No.: 646,220

[22] Filed: May 6, 1996

[30]     Foreign Application Priority Data

May 11, 1995   [JP]   Japan .................................. 7-137167

[51] Int. Cl.$^6$ ................................................ G10K 11/16
[52] U.S. Cl. ............................... 381/86; 381/94; 381/71
[58] Field of Search ................................. 381/71, 94, 86

[56]            References Cited

U.S. PATENT DOCUMENTS

| | | | |
|---|---|---|---|
| 4,506,380 | 3/1985 | Matsui | 381/71 |
| 5,111,507 | 5/1992 | Nakaji | 381/71 |
| 5,129,003 | 7/1992 | Saruta | 381/71 |
| 5,524,057 | 6/1996 | Akiho et al. | 381/71 |

FOREIGN PATENT DOCUMENTS 57195217   2/1997   Japan .

*Primary Examiner*—Forester W. Isen
*Attorney, Agent, or Firm*—Pollock, Vande Sande & Priddy

[57]            ABSTRACT

An electric source signal supplied from a battery of a vehicle is composed of a direct current component and an alternating current component. The alternating component is classified into an alternator noise of which a frequency changes in proportional to an engine speed of the vehicle and other noises. Also, as the engine speed is heightened, a vehicle noise in the inside of the vehicle is heightened. The direct current component of the electric source signal is removed in an alternating current component passing circuit, the other noises are removed in a band pass filter, and the alternator noise is obtained. Thereafter, a frequency of the alternator noise is calculated in a microcomputer, and a volume of a sound reproduced by a speaker of an on-vehicle stereo and a tone of the sound are adjusted according to the frequency of the alternator noise. Therefore, a driver can be entertained with a music without being disturbed by the vehicle noise.

10 Claims, 4 Drawing Sheets

ON-VEHICLE SOUND CONTROL APPARATUS

BACKGROUND OF THE INVENTION

1. Field of the Invention

The present invention relates generally to an on-vehicle sound control apparatus used for an on-vehicle stereo, and more particularly to an on-vehicle sound control apparatus in which a sound volume and the like are controlled according to a noise in a vehicle.

2. Description of the Related Art

A digital apparatus has been used for an on-vehicle stereo in a vehicle represented by a car, and a sound volume control apparatus has been recently attached to the on-vehicle stereo to control a sound volume of the on-vehicle stereo and the like according to a noise volume in a car. For example, a noise level in a car is detected by a microphone, a sound volume of the on-vehicle stereo is automatically increased when the noise level is high, and a sound volume of the on-vehicle stereo is automatically decreased when the noise level is low. Also, because a noise level correlates with a driving speed of a car or an engine speed (or the number of rotations in an engine) of a car, the driving speed or the engine speed is detected in place of the noise level to control a sound volume of the on-vehicle stereo.

Therefore, a driver can hear a music of the on-vehicle stereo and can be entertained with the music without being disturbed by a noise in the car. For example, this conventional on-vehicle sound control apparatus is disclosed in the Published Unexamined Japanese Utility Model Application No. S57-195217 of 1982.

3. Problems to be Solved by the Invention

However, in cases where a noise level in a car is detected by a microphone, a sound of a speaker of an on-vehicle stereo is undesirably detected by the microphone, so that there is a drawback that a noise level in the car cannot be accurately detected. Also, in cases where a driving speed of a car or an engine speed of a car is detected, a driving speed detector or an engine speed detector is additionally required. Therefore, there is a drawback that the manufacture of the on-vehicle sound control apparatus is complicated and the on-vehicle sound control apparatus cannot be manufactured at a low cost.

SUMMARY OF THE INVENTION

An object of the present invention is to provide, with due consideration to the drawbacks of such a conventional on-vehicle sound control apparatus, an on-vehicle sound control apparatus in which a noise level in a car is accurately detected at a low cost.

The object is achieved by the provision of an on-vehicle sound control apparatus, comprising:

first filtering means for removing a direct current component from an electric source signal supplied from an electric source of a vehicle to produce an alternating current signal, an electric power produced by an operation of an engine of the vehicle being charged in the electric source;

second filtering means for removing a particular frequency component from the alternating current signal produced by the first filtering means to take out an alternator noise, of which a frequency changes with a rotational speed of the engine of the vehicle, from the alternating current signal;

noise level calculating means for calculating a noise level in an inside of the vehicle according to the alternator noise obtained by the second filtering means; and controlling means for controlling a volume of a sound reproduced in a sound reproducing means or a tone of the sound according to the noise level calculated by the noise level calculating means.

In the above configuration, when the operation of the engine is started, an electric current is supplied from the electric source to an ignition plug of the engine, and the engine is operated. Thereafter, an electric power generated in an alternator which is actuated by the engine is always supplied to the electric source. Therefore, in cases where an electric source signal of the electric source is supplied to various electric circuits during the operation of the engine, an alternating current component including an alternator noise and other noises exists with a direct current component in the electric source signal. A frequency of the alternator noise changes with a rotational speed of the engine because the alternator noise is generated by the operation of the engine. The other noises are generated by switching on or off the various electric circuits. Also, as a running speed of the vehicle is heightened because of the increase of the rotational speed of the engine, a noise level in the inside of the vehicle is heightened, so that it becomes difficult to hear a sound reproduced in the sound reproducing means.

In the present invention, the alternator noise is taken out from the electric source signal by the first filtering means and the second filtering means, the noise level is calculated by the noise level calculating means according to the frequency of the alternator noise, and a sound volume of the sound or a tone of the sound is controlled according to the noise level by the controlling means.

Accordingly, because any noise detector is not used, the on-vehicle control apparatus can be easily manufactured at a low cost. Also, because there is no probability that a voice of a driver or the sound is detected as a noise in the vehicle, a noise level in the vehicle can be accurately calculated, and the sound volume of the sound or the tone of the sound can be appropriately controlled. That is, a driver can be always entertained with a music.

BRIEF DESCRIPTION OF THE DRAWINGS

The objects, features and advantages of the present invention will be apparent from the following description taken in conjunction with the accompanying drawings, in which.

DETAIL DESCRIPTION OF THE EMBODIMENTS

Preferred embodiments of an on-vehicle sound control apparatus according to the present invention are described with reference to drawings.

In the present invention, because an engine speed of a car correlates with a noise level in the car and an alternator noise correlates with the engine speed, a level of the alternator noise is calculated to produce noise information, and a sound volume of an on-vehicle stereo and a tone of the on-vehicle stereo are controlled according to the noise information.

Figure 1:
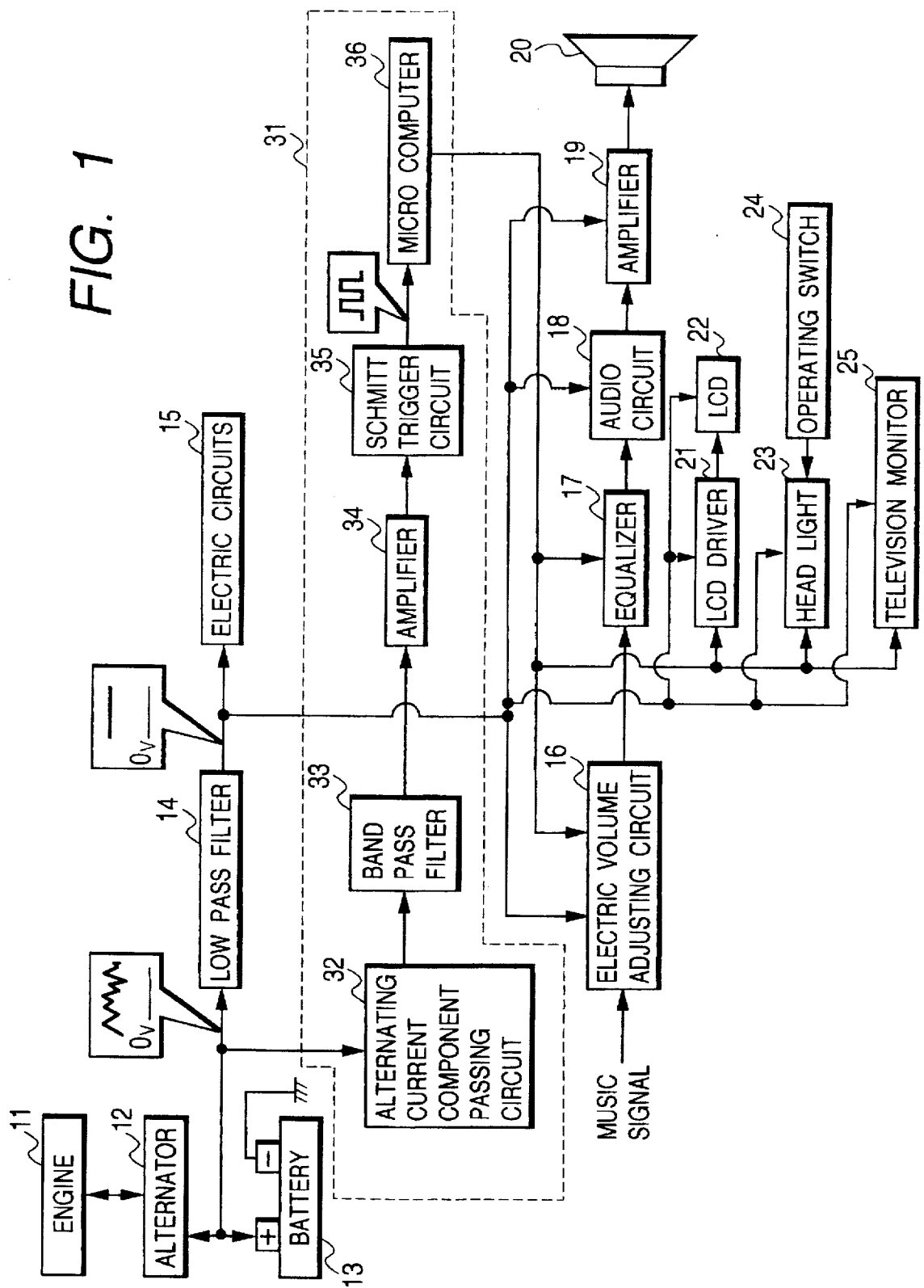
FIG. 1 is a block diagram of an on-vehicle sound control apparatus, mechanical parts and electric circuits in a car according to an embodiment of the present invention.

FIG. 1 is a block diagram of an on-vehicle sound control apparatus, mechanical parts and electric circuits in a car according to an embodiment of the present invention.

As shown in FIG. 1, a mechanical and electric portion of a car comprises an engine 11, an alternator (or an alternating current generator) 12 operated by the engine 11, a battery 13 for supplying an engine starting power to an ignition plug of the engine 11 and storing an electric power generated by the alternator 12 as an electric source, a low pass filter 14 connected with a plus-terminal of the battery 13 for removing various noises included in the electric source supplied from the battery 13 and taking out a direct current component from an electric source signal supplied from the battery 13, various electric circuits 15 operated by receiving the direct current component of the electric source signal from the battery 13 through the low pass filter 14, an electric volume adjusting circuit 16 for manually adjusting a sound volume of an on-vehicle stereo by changing a level of a music signal transmitted from a sound reproducing unit (not shown), an equalizer 17 for adjusting a tone of the on-vehicle stereo by changing a frequency component distribution of the music signal, an audio circuit 18 for generating an adjusted music signal according to the sound volume adjustment and the tone adjustment performed in the electric volume adjusting circuit 16 and the equalizer 17, an audio amplifier 19 for amplifying the adjusted music signal, a speaker 20 for reproducing a sound such as a music according to the amplified music signal, a liquid crystal display (LCD) driver 21 for actuating an LCD, an LCD 22 for displaying audio information of the music reproduced by the speaker 20, a head light 23 of the car, an operating switch 24 for manually operating the head light 23, and a television monitor 25 set in the car. A minus terminal of the battery is grounded, and the constitutional elements 16 to 25 are operated by receiving the direct current component of the electric source signal from the battery 13 through the low pass filter 14.

Also, an on-vehicle sound control apparatus 31 of the car comprises an alternating current (AC) component passing circuit 32 for removing the direct current component of the electric source signal supplied from the battery 13 and passing an alternating current component composed of various noise components, a band pass filter 33 for removing undesired noise components, occurring when a switch for supplying the electric source signal to an air conditioner, a head light, a klaxon or the like is turned on or off, from the alternating current component and passing a component of an alternator noise changing in proportion to an engine speed, an amplifier 34 for amplifying the component of the alternator noise, a Schmitt trigger circuit 35 for shaping the amplified alternator noise to a square wave of alternator noise, and a microcomputer 36 for producing a sound volume control signal, a tone control signal, a boosting signal, a head light control signal and a television monitor control signal according to the square wave of alternator noise.

In the above configuration of the on-vehicle sound control apparatus 31 and the mechanical and electric portion of the car, an operation of the on-vehicle sound control apparatus 31 is described.

When an engine operation is started, the alternator 12 is operated, an alternating current (AC) power is charged in the battery 13. Also, an electric source signal is supplied from the plus terminal of the battery 13 to the low pass filter 14 and the AC component passing circuit 32. The electric source signal is composed of a direct current component functioning as an electric source and an alternating current component indicating various noises. The alternating current component is classified into an alternator noise of which a frequency changes with an engine speed and undesired noises occurring when a switch for supplying an electric source to an air conditioner, a head light, a klaxon or the like is turned on or off.

Thereafter, the alternating current component of the electric source signal is removed in the low pass filter 14 to take out the direct current component, and the direct current component is used in the various circuits 15 such as a regulator and the like and the elements 16 to 25 as an electric power signal.

Also, the direct current component of the electric source signal is removed in the AC component passing circuit 32, and the alternating current component is supplied to the band pass filter 33. In the filter 33, high and low frequency components of the alternating current component are removed, and a noise existing in a range from 800 Hz to 10 kHz is taken out. This noise is called an alternator noise because a frequency of the noise changes in proportional to an engine speed. For example, low frequency noise components occurring when a switch for supplying the electric source signal to an air conditioner, a head light, a klaxon or the like is turned on or off are removed from the alternating current component. Also, low frequency components indicating fluctuation noises are removed from the alternating current component. Also, high frequency components of the alternating current component are removed to prevent an adverse influence of unknown high frequency noise components. Thereafter, the alternator noise is amplified in the amplifier 34, and a waveform of the alternator noise is shaped in the Schmitt trigger circuit 35 to produce a square wave of alternator noise. Therefore, the alternator noise can be processed in a microcomputer 36. That is, a sound volume control signal, a tone control signal, a boosting signal, a head light control signal and a television monitor control signal are produced in the microcomputer 36 according to the square wave of alternator noise.

Figure 2:
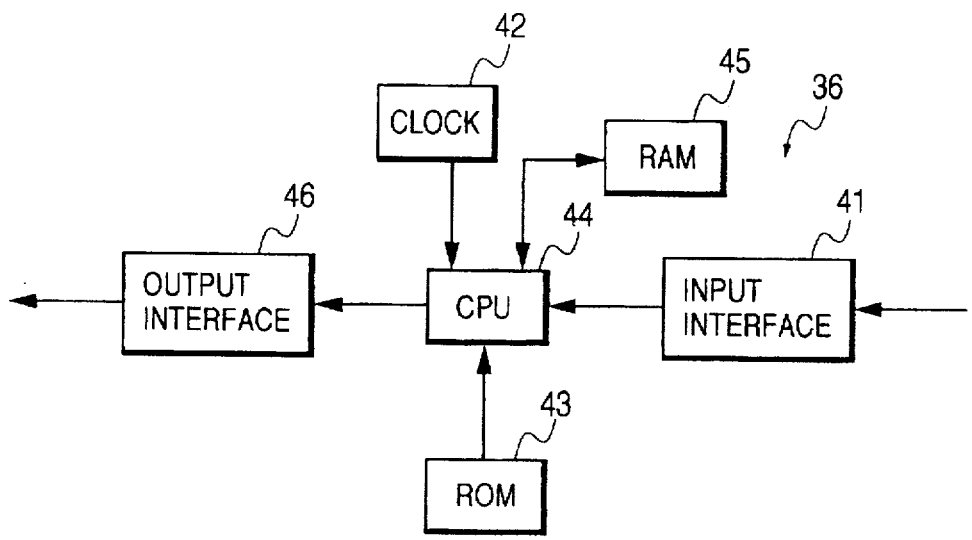
FIG. 2 is a block diagram of a microcomputer shown in FIG. 1.

FIG. 2 is a block diagram of the microcomputer 36 according to the embodiment of the present invention.

As shown in FIG. 2, the microcomputer 36 comprises an input interface 41 for receiving the square wave of alternator noise, a clock 42 for generating a clock signal to calculate a frequency of the alternator noise, a read only memory 43 for storing a control program executed to control a sound volume of a music and a tone of the music, a central processing unit (CPU) 44 for determining an update noise level and calculating a changing degree of the sound volume and a changing degree of the tone according to the control program, a random access memory (RAM) 45 for storing the update noise level as a noise level previously determined, and an output interface 46 for outputting various control signals Obtained in the CPU 44.

Figure 3:
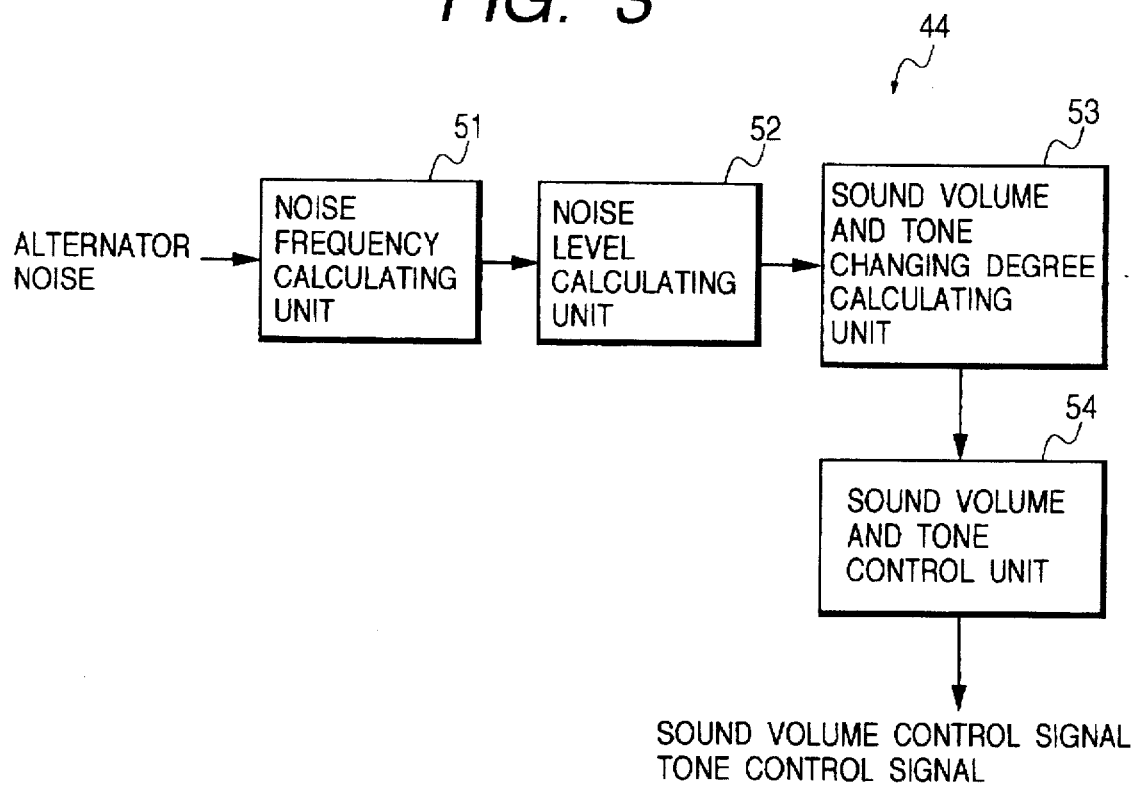
FIG. 3 is a functional block diagram of a CPU shown in FIG. 2.

FIG. 3 is a functional block diagram of the CPU 44 according to the embodiment of the present invention.

As shown in FIG. 3, the CPU 44 functionally comprises a noise frequency calculating unit 51 for calculating a frequency of the alternator noise, a noise level calculating unit 52 for calculating a noise level in the inside of the vehicle according to the frequency of the alternator noise, a sound volume and tone changing degree calculating unit 53 for calculating a changing degree of the sound volume and a changing degree of the tone according to a difference between a current noise level and a previous noise level, and a sound volume and tone control unit 54 for generating a sound volume control signal indicating the changing degree of the sound volume and a tone control signal indicating the changing degree of the tone.

In the above configuration of the microcomputer 36, an operation of the microcomputer 36 is described with reference to FIG. 4.

Figure 4:
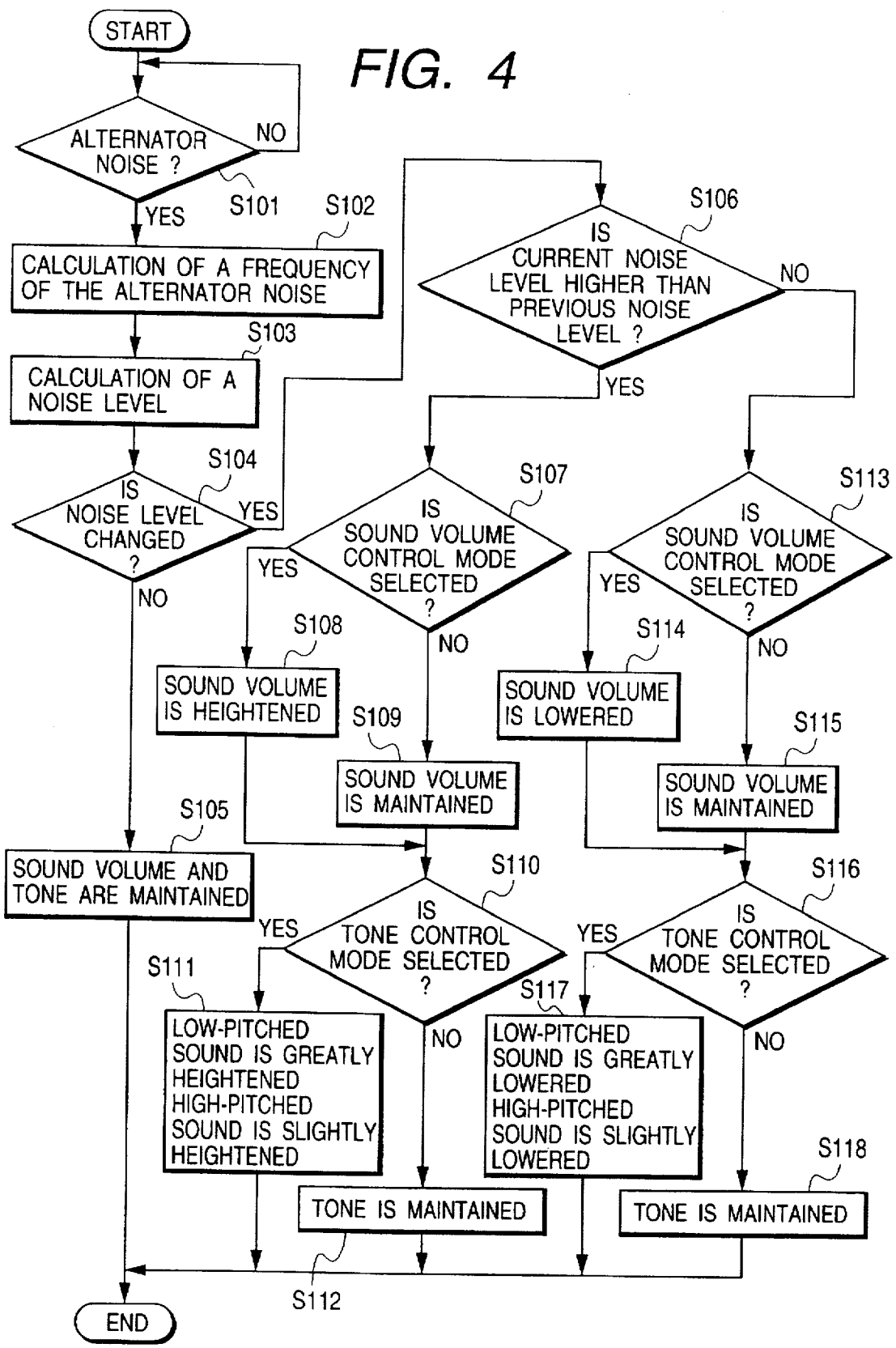
FIG. 4 shows a flow chart of an on-vehicle sound control method performed in the CPU.

FIG. 4 shows a flow chart of an on-vehicle sound control method performed in the CPU 44.

As shown in FIG. 4, when the square wave of alternator noise is transmitted to the CPU 44 through the input interface 41, it is judged in a step S101 that an alternator noise is input to the microcomputer 36 because of the operation of the engine 11, and a noise frequency is calculated in the noise frequency calculating unit 51 in a step S102 by counting the number of clock signals of the clock 42 each time a pulse of the alternator noise is input to the microcomputer 36. Thereafter, a noise level is calculated in the noise level calculating unit 52 according to the noise frequency in a step S103. For example, when the noise frequency is equal to or lower than 1500 Hz, it is judged that a noise level in the car is very low because the engine 11 is set in an idling condition and the engine speed is low, so that the noise level is set to "0". Also, when the noise frequency ranges from 1500 Hz to 2500 Hz, it is judged that a low vehicle noise occurs in the car because a driver steps on an accelerator of the car, so that the noise level is set to "1". Also, when the noise frequency ranges from 2500 Hz to 3500 Hz, it is judged that a middle vehicle level of noise occurs in the car, so that the noise level is set to "2". Also, when the noise frequency ranges from 3500 Hz to 4500 Hz, it is judged that a high level of vehicle noise occurs in the car, so that the noise level is set to "3". Also, when the noise frequency is higher than 4500 Hz, it is judged that a very high level of vehicle noise occurs in the car, so that the noise level is set to "4".

Thereafter, a noise level previously calculated is read out from the RAM 45, and it is judged in the sound volume and tone changing degree calculating unit 53 in a step S104 whether or not the noise level currently calculated differs from the noise level previously calculated. In cases where the noise level currently calculated agrees with that previously calculated, the procedure proceeds to a step S105. In the step S105, a sound volume control signal and a tone control signal indicating that a changing degree of the sound volume and a changing degree of the tone are set to zero are generated in the sound volume and tone control unit 54, and the control signals are output from the CPU 44 through the output interface 46. In contrast, in cases where the noise level currently calculated differs from that previously calculated, it is judged in a step S106 whether or not the noise level currently calculated is higher than that previously calculated.

In cases where the noise level currently calculated is higher than that previously calculated, it is judged in a step S107 whether or not a sound volume control mode is selected by a driver. In cases where the sound volume control mode is selected, because a volume change of a sound reproduced by the speaker 20 is allowed by the driver, a sound volume control signal indicating that the sound volume is heightened by a changing degree proportional to the difference between the noise level currently calculated and the noise level previously calculated is generated in the sound volume and tone control unit 54 in a step S108, and the sound volume control signal is output from the CPU 44 through the output interface 46 to the electric volume adjusting circuit 16. Thereafter, the procedure proceeds to a step S110. Also, in cases where the sound volume control mode is not selected, a sound volume control signal indicating that a changing degree of the sound volume is set to zero is generated in the sound volume and tone control unit 54 in a step S109, and the sound volume control signal is output from the CPU 44 through the output interface 46 to the electric volume adjusting circuit 16. Thereafter, the procedure proceeds to the step S110. In the step S110, it is judged whether or not a tone control mode is selected by a driver. In cases where the tone control mode is selected, because a tone change of the sound reproduced by the speaker 20 is allowed by the driver, a tone control signal indicating that a level of a low-pitched sound reproduced by the speaker 20 is greatly heightened by a high changing degree proportional to the difference between the noise level currently calculated and the noise level previously calculated and a level of a high-pitched sound reproduced by the speaker 20 is slightly heightened by a low changing degree proportional to the difference is generated in the sound volume and tone control unit 54 in a step S111, and the tone control signal is output from the CPU 44 through the output interface 46 to the equalizer 17. The reason that the level of the low-pitched sound is greatly heightened and the level of the high-pitched sound is slightly heightened is described with reference to FIG. 5.

Figure 5:
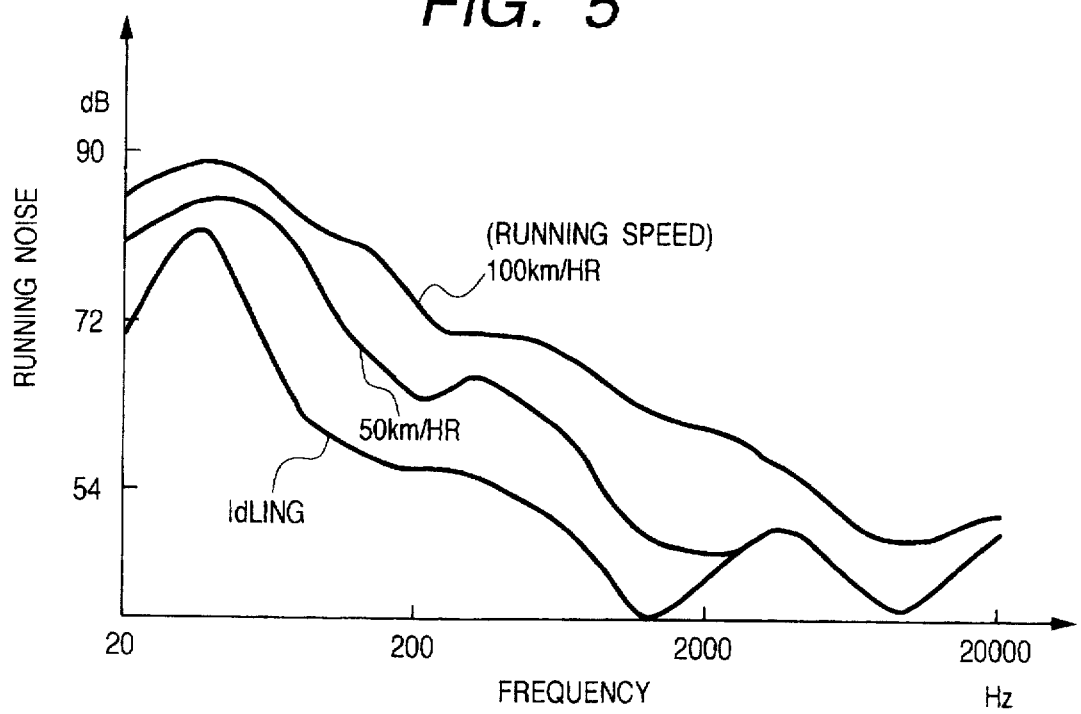
FIG. 5 shows frequency characteristics of noises occurring when a car is driven.

As shown in FIG. 5, a level of vehicle noise caused by the operation of the engine 11 and a rotational movement of tires has a peak at a low frequency band and is low at a high frequency band. In this case, when the noise level is heightened, regardless of whether the sound volume is heightened in the step S108, the level of a running noise for a low frequency band is higher than that for a high frequency band. Therefore, it is required to greatly heighten the level of the low-pitched sound and to slightly heighten the level of the high-pitched sound. That is, it is required to change a tone of the sound.

Also, in cases where the tone control mode is not selected, because the change of the tone is not allowed by the driver, a tone control signal indicating that a changing degree of the tone is set to zero is generated in the sound volume and tone control unit 54 in a step S112, and the tone control signal is output from the CPU 44 through the output interface 46 to the equalizer 17.

In contrast, in cases where the noise level currently calculated is lower than that previously calculated in the step S106, it is judged in a step S113 whether or not the sound volume control mode is selected by the driver. In cases where the sound volume control mode is selected, a sound volume control signal indicating that the sound volume is lowered by a changing degree proportional to the difference between the noise level currently calculated and the noise level previously calculated is generated in the sound volume and tone control unit 54 in a step S114, and the sound volume control signal is output from the CPU 44 through the output interface 46 to the electric volume adjusting circuit 16. Thereafter, the procedure proceeds to a step S116. Also, in cases where the sound volume control mode is not selected, a sound volume control signal indicating that a changing degree of the sound volume is set to zero is generated in the sound volume and tone control unit 54 in a step S115, and the sound volume control signal is output from the CPU 44 through the output interface 46 to the electric volume adjusting circuit 16. Thereafter, the procedure proceeds to the step S116. In the step S116, it is judged whether or not the tone control mode is selected by a driver. In cases where the tone control mode is selected, a tone control signal indicating that a level of a low-pitched sound reproduced by the speaker 20 is greatly lowered by a high changing degree proportional to the difference between the noise level currently calculated and the noise level previously calculated and a level of a high-pitched sound reproduced by the speaker 20 is slightly lowered by a low changing degree proportional to the difference is generated in the sound volume and tone control unit 54 in a step S117, and the tone control signal is output from the CPU 44 through the output interface 46 to the equalizer 17. Also, in cases where the tone control mode is not selected, a tone control signal indicating that a changing degree of the tone is set to zero is generated in the sound volume and tone control unit 54 in a step S118, and the tone control signal is output from the CPU 44 through the output interface 46 to the equalizer 17.

The changing degree indicated by each of the sound volume and tone control signals is expressed by a decibel (dB) unit.

Thereafter, a level of a music signal input to the electric volume adjusting circuit 16 is maintained, heightened or reduced according to the sound volume control signal, and levels of the high and low frequency bands of the music signal are maintained or changed according to the tone control signal in the equalizer 17. Thereafter, a well-known speech signal processing such as a noise removal is performed for the music signal in the audio circuit 18, the music Signal is amplified in the amplifier 19, and the sound such as a music is reproduced from the music signal by the speaker 20.

Accordingly, because a noise level in the car is numerically calculated and the sound volume and the tone are adjusted in the microcomputer 36, the noise level can be accurately detected, and the driver can hear the sound reproduced by an on-vehicle stereo composed of the elements 16 to 20 and can be entertained with the music without being disturbed by any vehicle noise in the car.

Also, because the determination of the noise level is performed in the microcomputer 36 according to the alternator noise obtained from the electric source signal of the battery 13, any noise detector is not required, and the on-vehicle sound control apparatus 31 can be manufactured at a low cost, and the provision of the on-vehicle sound control apparatus 31 in the car can be easily performed because a size of the on-vehicle sound control apparatus 31 is smaller than that of a noise detector.

Also, because any microphone is not used, the sound of the speaker 20 or a voice of the driver is not detected as a vehicle noise, the noise level in the car can be correctly detected.

Figure 6:
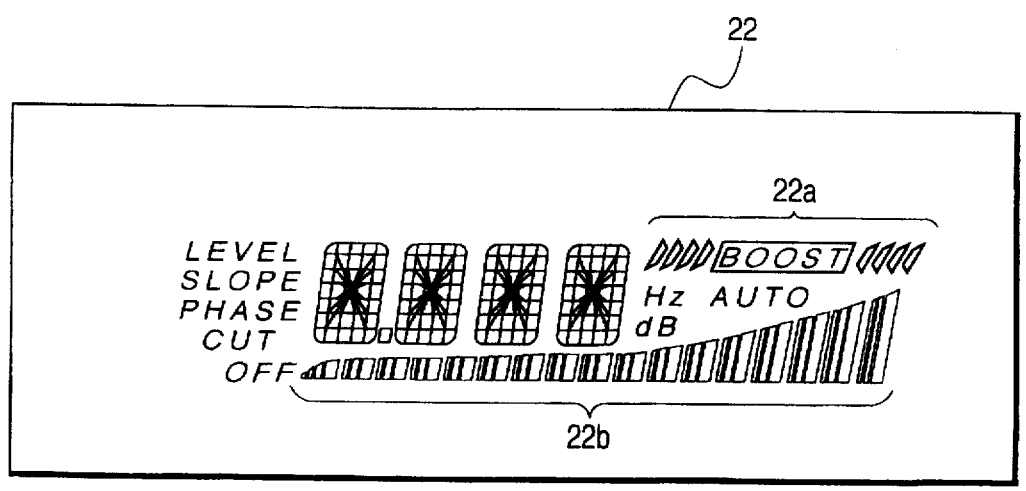
FIG. 6 shows a liquid crystal display (LCD) composed of many optical devices.

In a first modification of the embodiment, a piece of boost information (or the sound volume control signal) indicating the changing degree of the sound volume is supplied from the microcomputer 36 to the LCD driver 21, and the LCD 22 is operated according to an actuating signal of the LCD driver 21. For example, as shown in FIG. 6, each of optical devices arranged at both sides of a boost displaying section 22a of the LCD 22 is lighted up according to the changing degree of the sound volume. Also, each of optical devices arranged at a level indicator 22b of the LCD 22 is lighted up according to an absolute level of the sound obtained in the audio circuit 18.

Also, in a second modification of the embodiment, a noise signal indicating the input of the alternator noise to the microcomputer 36 (step S101) and a noise frequency signal indicating the noise frequency calculated in the step S103 are transmitted from the microcomputer 36 to the head light 23, and the head light 23 is lighted up or off. For example, when the noise signal is received by the head light 23, because the operation of the engine 11 is started, the head light 23 is lighted on. Thereafter, as the noise frequency indicated by the noise frequency signal is heightened, a luminous intensity of the head light 23 is heightened because a running speed of the car is heightened. In this case, the light up or off of the head light 23 according to the noise signal is overridden by a switching operation of the operating switch 24.

Also, in a third modification of the embodiment, a noise level signal indicating the noise level calculated in the step S103 is transmitted from the microcomputer 36 to the television monitor 25, and the television monitor 25 is set in a standby condition according to the noise level signal. For example, when the car is stopped because of a traffic signal, the driver becomes tedious. Therefore, when a noise level signal indicating the noise level "0" is received, because the car is set in an idling condition, the television monitor 25 is set in a standby condition. That is, when the television monitor 25 is switched on by the driver, the driver can be entertained by the television monitor 25. Also, when a noise level signal indicating the noise level "1", "2", "3" or "4" is received, because the car is moved, the television monitor 25 is set in an off condition. That is, even though the television monitor 25 is switched on, the television monitor 25 is not operated.

Also, in a fourth modification of the embodiment, a running speed of the car is proportional to the noise frequency calculated in the step S102. Therefore, an operating type changing switch (not shown) is operated by the driver to use the level indicator 22a of the LCD 22 as a tachometer, and the noise frequency is transmitted from the microcomputer 36 to the LCD 22 through the LCD driver 21 to indicate an engine speed of the car.

Also, in a fifth modification of the embodiment, a noise level signal indicating the noise level calculated in the step S103 is transmitted from the microcomputer 36 to a room lamp (not shown) or a map lamp (not shown), and the room lamp or the map lamp is automatically lighted up when the noise level indicated by the noise level signal is "0". Therefore, when the car is set in an idling condition, the inside of the car can be brightened, and the driver can see a map in the midnight. Also, when the noise level indicated by the noise level signal is "1", "2", "3" or "4", the room lamp or the map lamp is automatically lighted off. Therefore, the driver can safely drive the car.

Having illustrated and described the principles of the present invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. An on-vehicle sound control apparatus, comprising:
first filtering means for removing a direct current component from an electric source signal supplied from an electric source of a vehicle to produce an alternating current signal, an electric power produced by an operation of an engine of the vehicle being charged in the electric source;

second filtering means for removing a particular frequency component from the alternating current signal produced by the first filtering means to take out an alternator noise, of which a frequency changes with an engine speed of the vehicle, from the alternating current signal;

noise level calculating means for calculating a noise level in an inside of the vehicle according to the alternator noise obtained by the second filtering means; and controlling means for controlling a volume of a sound reproduced in a sound reproducing means or a tone of the sound according to the noise level calculated by the noise level calculating means.

2. An on-vehicle sound control apparatus according to claim 1 in which the second filtering means is a band pass filter for removing high and low frequency components from the alternating current signal.

3. An on-vehicle sound control apparatus according to claim 1 in which a frequency of the alternator noise ranges from 800 to 10 kHz.

4. An on-vehicle sound control apparatus according to claim 1 in which the noise level calculating means comprises:

a noise frequency calculating unit for calculating a frequency of the alternator noise; and a noise level calculating unit for calculating the noise level according to the frequency of the alternator noise calculated by the noise frequency calculating unit.

5. An on-vehicle sound control apparatus according to claim 1 in which the controlling means comprises:

a sound volume and tone changing degree calculating unit for calculating a first changing degree of the sound volume or a second changing degree of the tone according to a difference between the noise level currently calculated and a previous noise level; and a sound volume and tone control unit for adjusting the sound volume by the first changing degree calculated by the sound volume and tone changing degree calculating unit or adjusting the tone by the second changing degree calculated by the sound volume and tone changing degree calculating unit.

6. An on-vehicle sound control apparatus according to claim 1 in which the controlling means comprises:

a sound volume and tone changing degree calculating unit for calculating a first changing degree of the sound volume or a second changing degree of the tone according to a difference between the noise level currently calculated and a previous noise level; and a sound volume and tone control unit for performing the increase of the volume of the sound, the increase of a low-pitched component of the sound and the decrease of a high-pitched component of the sound in cases where the noise level currently calculated is higher than the previous noise level and performing the decrease of the volume of the sound, the decrease of the low-pitched component of the sound and the increase of the high-pitched component of the sound in cases where the noise level currently calculated is lower than the previous noise level.

7. An on-vehicle sound control apparatus according to claim 1, further comprising sound volume indicating means for visually indicating the change of the sound volume and the sound volume controlled by the controlling means.

8. An on-vehicle sound control apparatus according to claim 1, further comprising a head light for illuminating a forward position of the vehicle at a luminance intensity which is determined according to the noise level calculated by the noise level calculating means.

9. An on-vehicle sound control apparatus according to claim 1, further comprising a television monitor for displaying a picture by turning on a switch on condition that the noise level calculated by the noise level calculating means indicates that the vehicle is set in an idling condition.

10. An on-vehicle sound control apparatus according to claim 1, further comprising a tachometer for indicating the engine speed of the vehicle according to the alternator noise obtained by the second filtering means.

* * * * *